United States Patent [19]

Koshino

[11] Patent Number: 4,683,394
[45] Date of Patent: Jul. 28, 1987

[54] ACOUSTIC SURFACE WAVE RESONATOR DEVICE

[75] Inventor: Masayoshi Koshino, Tokyo, Japan

[73] Assignee: Kabushiki Kaisha Toshiba, Kawasaki, Japan

[21] Appl. No.: 872,638

[22] Filed: Jun. 10, 1986

Related U.S. Application Data

[63] Continuation of Ser. No. 678,756, Dec. 5, 1984, abandoned.

[30] Foreign Application Priority Data

| Dec. 15, 1983 | [JP] | Japan | 58-235061 |
| Mar. 6, 1984 | [JP] | Japan | 59-41255 |
| Mar. 6, 1984 | [JP] | Japan | 59-41256 |
| Aug. 23, 1984 | [JP] | Japan | 59-174125 |

[51] Int. Cl.$^4$ ............................................. H01L 41/08
[52] U.S. Cl. ............................. 310/313 R; 310/313 B; 310/313 D; 333/195
[58] Field of Search ........... 310/313 R, 313 A, 313 B, 310/313 C, 313 D, 148; 333/151–155, 193–196

[56] References Cited

U.S. PATENT DOCUMENTS

| 3,885,173 | 5/1975 | Lee | 310/313 B |
| 4,047,129 | 9/1977 | Ishiyama | 333/193 |
| 4,250,473 | 2/1981 | Gemba | 333/194 X |
| 4,382,386 | 5/1983 | Coussot et al. | 310/313 B |
| 4,423,395 | 12/1983 | Shirahama | 333/193 |
| 4,438,417 | 3/1984 | Yamashita et al. | 333/193 |
| 4,472,652 | 9/1984 | Brice et al. | 310/313 B |

FOREIGN PATENT DOCUMENTS 0012545 1/1979 Japan ............................... 310/313 B Primary Examiner—Mark O. Budd
Attorney, Agent, or Firm—Cushman, Darby & Cushman

[57] ABSTRACT

An acoustic surface wave resonator element has first and second interdigital electrodes consisting of pairs of opposed interleaving comb-shaped electrodes formed on one major surface of a piezoelectric substrate and arrayed along an acoustic wave propagation direction on the piezoelectric substrate, and acoustic surface wave reflectors sandwiching the first and second interdigital electrodes along the acoustic surface wave propagation direction. A base has the resonator element mounted thereon. First and second lead terminals are formed on the base and are electrically connected to the pair comb-shaped electrodes constituting the first interdigital electrode. A third lead terminal is electrically connected to one of the pair comb-shaped electrodes constituting the second interdigital electrode. The distance between the first and third lead terminals is substantially equal to that between the second and third lead terminals.

26 Claims, 27 Drawing Figures

FIG. 4
(PRIOR ART)
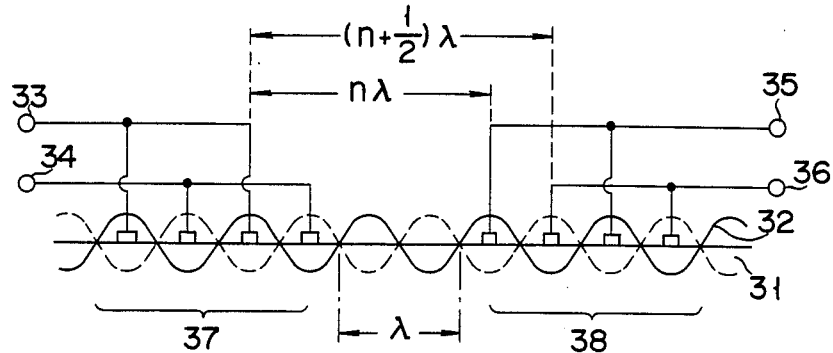
FIG. 5(a)
(PRIOR ART)
FIG. 5(b)
(PRIOR ART)
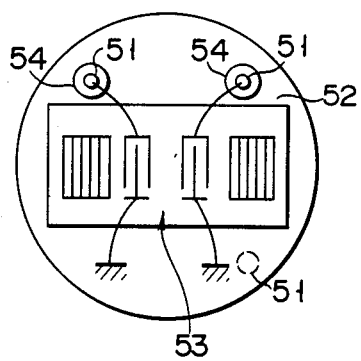 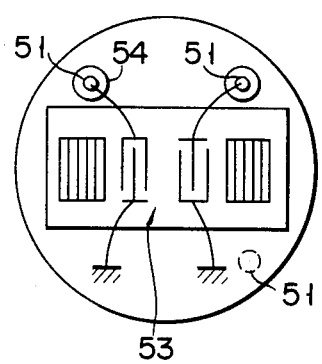
FIG. 6(a)
(PRIOR ART)
FIG. 6(b)
(PRIOR ART)
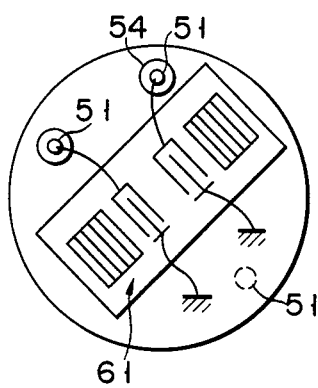 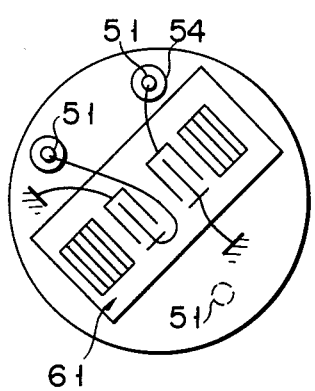

F I G. 22
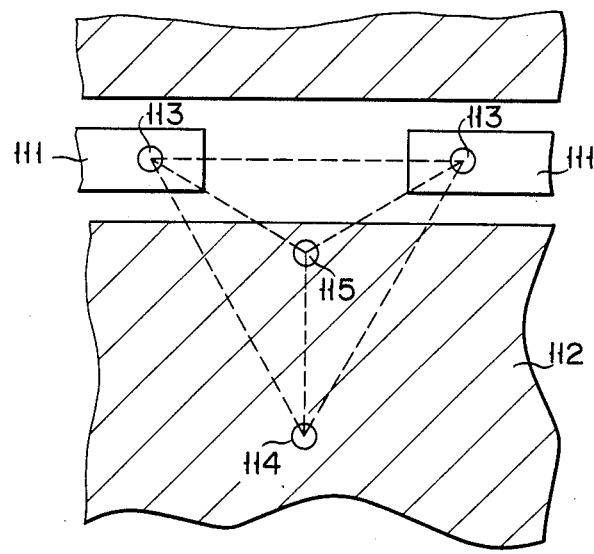
F I G. 23
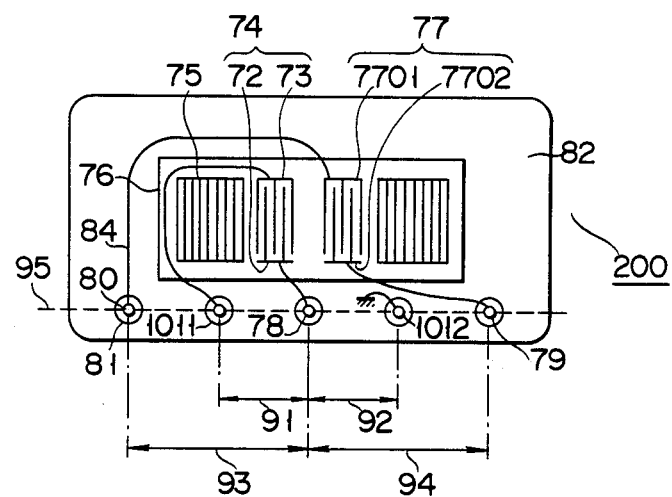

F I G. 24
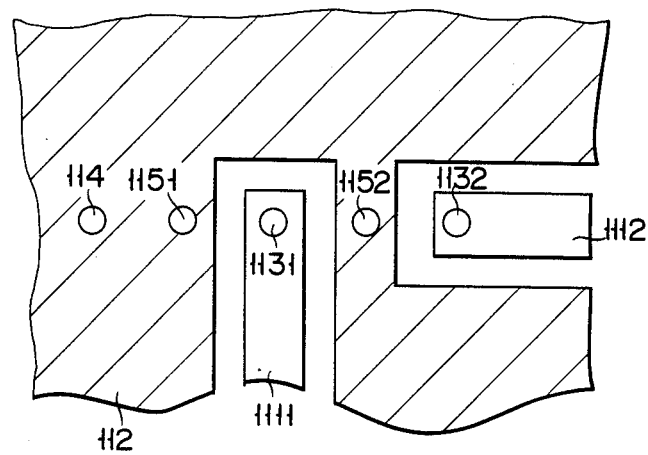
F I G. 25
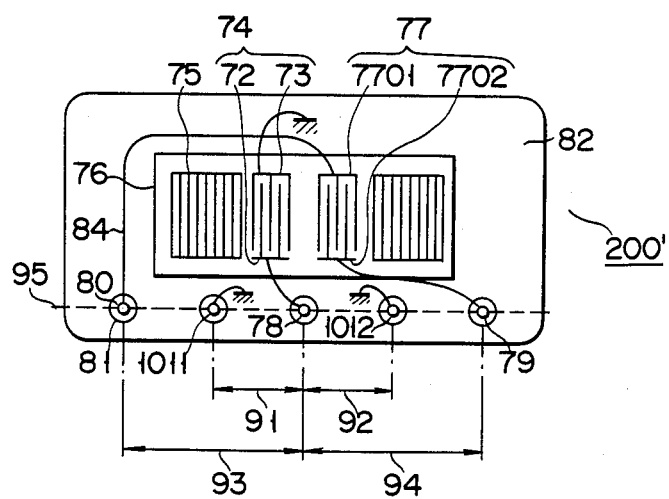

ACOUSTIC SURFACE WAVE RESONATOR DEVICE

This is a continuation of application Ser. No. 678,756, filed Dec. 5, 1984 which was abandoned upon the filing hereof now abandoned.

BACKGROUND OF THE INVENTION

This invention relates to an acoustic surface wave resonator device and, more particularly, an acoustic surface wave resonator device which has a specific lead terminal connection and wiring structure to allow both in phase and out of phase operations.

In the fields of communications and among other categories of electrical equipment, demands have arisen for filters or oscillating frequency controllers having very narrow frequency response characters. U.S. Pat. No. 3,886,504 discloses one technique responding to these demands. According to this patent, as shown in FIG. 1, two sets of interdigital electrodes each consisting of a pair of interleaving comb-shaped electrodes 2, and two acoustic surface wave (SAW) reflectors 3 sandwiching them are arranged on a piezoelectric substrate 1.

An oscillator using such a SAW resonator 11 has the configuration as shown in FIG. 2. In the oscillator shown in FIG. 2, a SAW resonator 11 having a high Q factor is connected to an amplifier 12 to form a feedback loop and oscillates at a frequency satisfying:

$$Gamp + Gres \geq 1 \qquad \ldots A$$

$$\Phi amp + \Phi res = 2n\pi \qquad \ldots B$$

where Gamp and Gres are gains of the amplifier 12 and the SAW resonator 11, respectively, Gres being smaller than unity, and Φamp and Φres are phase shifts of the amplifier 12 and the SAW resonator 11, respectively. In this case, in accordance with the circuit configuration, the amplifier 12 is classified into in phase type ($\Phi amp \simeq 2n\pi$) and out of phase type ($\Phi amp \simeq (2n+1)\pi$). For this reason, in accordance with the amplifier 12, the SAW resonator 11 must be of in phase type ($\Phi res \simeq 2n\pi$) and out of phase type ($\Phi res \simeq (2n+1)\pi$).

FIG. 3 shows the frequency characteristics of the SAW resonator shown in FIG. 2.

Referring to FIG. 3, curve 21 shows amplitude characteristics, curve 22 shows phase characteristics of a SAW resonator of out of phase type, and curve 23 shows phase characteristics of a SAW resonator of in phase type. Note that the curves 22 and 23 show the same characteristics except that they are out of phase.

In a SAW resonator, the phases of input/output electrodes are mainly determined in accordance with the relative positions of fingers of the two sets of comb-shaped electrodes. FIG. 4 shows a state wherein a standing wave 32 is generated on a piezoelectric substrate 30 at a frequency in the vicinity of the resonance frequency of the SAW resonator. Referring to FIG. 4, electrical signals at terminals 33 and 35 are substantially in phase, and phase shifts between are of in phase type. However, phase shifts between terminals 33 and 36 are of out of phase type. When the distance between the centers of fingers of the two sets of comb-shaped electrodes connected to terminals as input/output terminals of electrical signals is an n multiple of an acoustic surface wavelength λ at the resonance frequency, phase shifts are of in phase type. However, when this distance is $(n+\frac{1}{2})$ the wavelength λ, phase shifts are of out of phase type. Reference numerals 37 and 38 denote fingers of the interdigital electrodes.

In consideration of the above, when SAW resonators of in phase type and out of phase type are actually realized, the following structure is adopted:

The first structure will be described with reference to FIGS. 5(a) and 5(b). A SAW resonator shown in FIG. 5(a) is of in phase type wherein three lead terminals, e.g., lead pins 51 are formed, and bonding pads at the signal sides of interdigital electrodes 53 are formed at one side of a stem 52. A SAW resonator shown in FIG. 5(b) is of out of phase type wherein the relative positions of the two signal output fingers are shifted by λ/2 from that shown in FIG. 5(a). Therefore, the first structure requires two types of SAW resonators. For this reason when SAW resonators are formed by patterning, two types of glass masks for photoetching are required for in phase type and out of phase type. This complicates the manufacturing process, resulting in inconvenience. Reference numeral 54 denotes a glass member for mounting each lead pin 51 on the stem 52.

The second structure will be described with reference to FIGS. 6(a) and 6(b). In accordance with this structure, two types of SAW resonators are manufactured using SAW resonators 61 of the same type but adopting different bonding positions. Although this second structure does not require the use of two types of SAW resonators, two different bonding procedures must be followed for in phase type and out of phase type SAW resonators.

Common problems with the first and second structures result in the manufacturing process becoming complex and a user must use two types of SAW resonators for assembling an oscillator using SAW resonators of these structures. When mass-production is necessary, since a single SAW resonator cannot be operated as either an in phase or out of phase type SAW resonator, a user must specify the particular type when ordering SAW resonators from a factory. This makes the designing of oscillators difficult.

SUMMARY OF THE INVENTION

It is, therefore, an object of the present invention to provide a new and improved acoustic surface resonator device in which phase shifts can be both in phase or out of phase type and a single type of printed circuit board can be used for SAW resonators of both in phase and out of phase type.

According to the present invention, an acoustic surface wave resonator element comprises first and second interdigital electrodes each consisting of a pair of interleaving comb-shaped electrodes arranged on one major surface of a piezoelectric substrate and arranged along an acoustic surface wave propagation direction on said piezoelectric substrate, and acoustic surface wave reflectors arranged to sandwich the first and second interdigital electrodes in the acoustic surface wave propagation direction. The acoustic surface wave element is placed on a base. First and second lead terminals are arranged on the base and are electrically connected to the comb-shaped electrode pair constituting the first interdigital electrode. A third lead terminal is formed on the base and is electrically connected to one of the comb-shaped electrodes constituting the second interdigital electrode. A distance between the first and third lead teminals is set to be substantially the same as that between the second and third lead terminals.

BRIEF DESCRIPTION OF THE DRAWINGS

The present invention can be understood by reference to the accompanying drawings, in which:

FIG. 4 is a diagram showing a standing wave in the SAW resonator;

FIGS. 5(a) and 5(b) are plan views showing a conventional SAW resonator;

FIGS. 6(a) and 6(b) are plan views showing another conventional SAW resonator;

FIG. 22 is a schematic view showing a printed circuit board for mounting the SAW resonator shown in FIG. 21;

FIG. 23 is a plan view of a ninth embodiment of an acoustic wave resonator of the present invention;

FIG. 24 is a schematic view of a printed circuit board for mounting the SAW resonator shown in FIG. 23; and FIG. 25 is a plan view of a tenth embodiment of an acoustic surface wave resonator of the present invention.

DETAILED DESCRIPTION OF THE PREFERRED EMBODIMENTS

In view of the problems discussed above, the present inventors have developed an acoustic surface wave resonator wherein phase shifts can be both in phase and out of phase types. In this SAW resonator, comb-shaped electrodes constituting a first interdigital electrode are electrically connected to a lead pin. One of the comb-shaped electrodes of a second interdigital electrode is connected to a lead pin, while the other is grounded through a stem. Therefore, a single SAW resonator can be operated as either an in phase or out of phase type SAW resonator.

A basic example of a SAW resonator previously proposed by the present inventors will be described below before describing the present invention.

Figure 7:
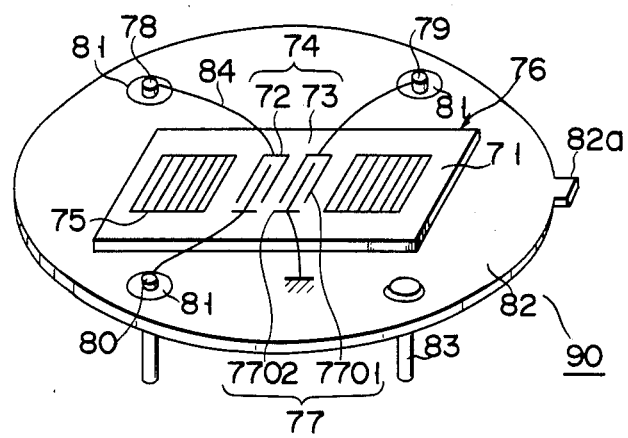
FIG. 7 is a perspective view showing a basic example of a SAW resonator previously proposed by the present inventors.

Referring to FIG. 7, a plurality of interleaving comb-shaped electrodes 72 and 73 are formed on one major surface of a piezoelectric substrate 71 consisting of LiTaO$_3$, LiNbO$_3$ or quartz to form two sets of interdigital electrodes 74 and 77. Two sets of SAW reflectors 75 sandwich the two sets of interdigital electrodes 74 and 77 and are also formed on the one major surface of the piezoelectric substrate 71. Thus, a SAW resonator element 76 is formed. Three lead terminals, for example, lead pins 78, 79 and 80 are mounted in a stem 82 comprising an iron plate or the like each through adhering member 81. Another lead pin 83 as a grounding pin is directly mounted in the stem 82. The SAW resonator element 76 is mounted on the stem 82 through adhering members (not shown). The comb-shaped electrodes 72 and 73 constituting the first interdigital electrode 74 of the SAW resonator element 76 are electrically connected to the lead pins 78 and 80 through bonding wires 84. On comb-shaped electrode 7701 of the two electrodes constituting the second interdigital electrode 77 is electrically connected to the lead pin 79 through another bonding wire 84. The other comb-shaped electrode 7702 is grounded to the stem 82 through still another bonding wire 84. In a SAW resonator 90 obtained in this manner, the lead pin 78 serves as an in phase lead pin and the lead pin 80 serves as an out of phase lead pin. The structure is encapsulated in a shell to complete the SAW resonator 90. A projection 82a formed in the stem 82 serves as a guide when the resonator 90 is mounted on a printed circuit board.

Figure 8:
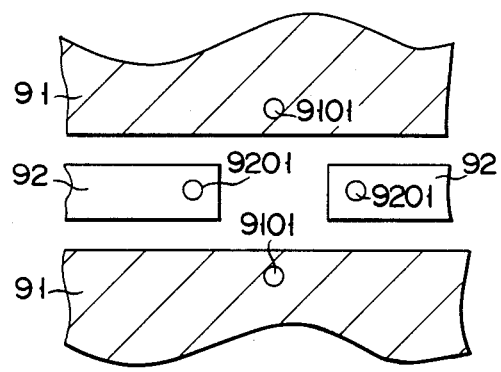
FIG. 8 is a schematic view showing a printed circuit board for mounting the SAW resonator shown in FIG. 7.

When the SAW resonator 90 is operated as an out of phase type SAW resonator, a printed pattern of a printed circuit board as shown in FIG. 8 is used. Referring to FIG. 8, reference numeral 91 denotes a grounding line pattern, and reference numeral 92 denotes a signal line pattern. When this printed pattern is used, the lead pins 78 and 83 of the SAW resonator 90 are inserted in openings 9101, and the lead pins 80 and 79 are inserted in openings 9201.

Figure 9:
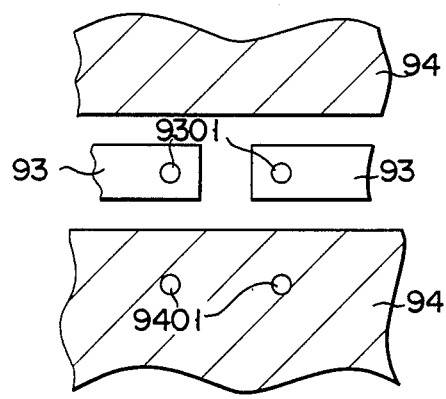
FIG. 9 is a schematic view showing a printed circuit board for mounting the SAW resonator shown in FIG. 7.

When this SAW resonator 90 is used as an in phase type SAW resonator, a printed pattern of a printed circuit board shown in FIG. 9 is used. Referring to FIG. 9, reference numeral 94 denotes a grounding pattern, and reference numeral 93 denotes a signal pattern. When this printed pattern is used, the lead pins 78 and 79 of the SAW resonator 90 are inserted in openings 9301, and the lead pins 80 and 83 are inserted in openings 9401.

As described above, a single SAW resonator 90 can be operated as either an in phase or out of phase type SAW resonator. However, when the SAW resonator 90 is to be used as either an in phase or out of phase type, since the arrangement of the lead pins 78, 79, 80 and 83 must be different, a printed circuit board of an oscillator for mounting such a SAW resonator 90 must also be wired to allow the resonator to operate as a SAW resonator of either type. In the particular case when an SAW resonator is employed, a high frequency of 50 MHz to 2 GHz must be used. For this reason, the slightest change in wiring of a printed circuit board changes the stray capacitance and oscillating conditions.

Some embodiments of the present invention which are developed from this basic example will be described below.

Figure 10:
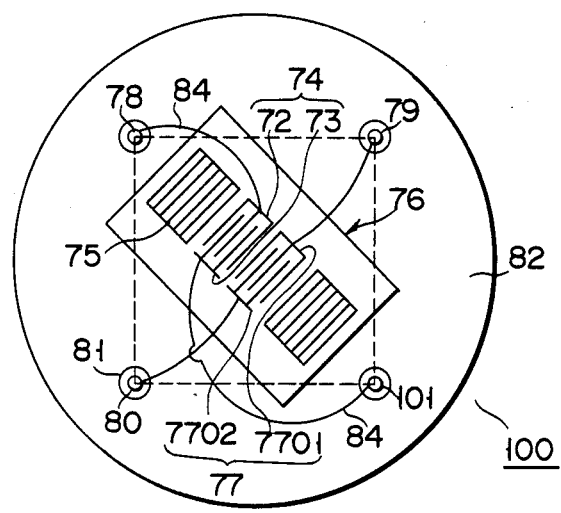
FIG. 10 is a plan view showing a first embodiment of an acoustic surface wave resonator of the present invention.

In FIG. 10 showing a first embodiment, the basic structure of a SAW resonator 100 is the same as that of the SAW resonator 90 previously proposed by the present inventors and will not be described in detail. In FIG. 10 showing the SAW resonator 100, the same reference numerals as in FIG. 7 showing the SAW resonator 90 denote the same parts.

Referring to FIG. 10, a SAW resonator element 76 has interdigital electrodes 74 and 77 and two sets of SAW reflectors 75. The SAW resonator element 76 is mounted on a base, for example, a stem 82 consisting of a metal. Lead pins 78, 79, 80 and 101 are mounted to extend through the stem 82 each through the adhering member 81 so that the tops of the respective lead pins correspond to corners of a square indicated by the broken line on the surface of the stem 82 mounting the SAW resonator element 76 thereon. In other words, the distance between the lead pins 78 and 80 is set to be equal to that between the lead pins 78 and 79. A first comb-shaped electrode 7701 of the interdigital electrode 77 is electrically connected to the lead pin 79 through a bonding wire 84. A second comb-shaped electrode 7702 is electrically connected to the lead pin 80 through a bonding wire 84. A first comb-shaped electrode 72 of the other interdigital electrode 74 is connected to the lead pin 78 through a bonding wire 84, and a second comb-shaped electrode 73 is connected to the lead pin 101 through a bonding wire 84.

In this SAW resonator 100, the lead pin 79 serves as an in phase lead pin, and the lead pin 80 serves as an out of phase lead pin. The structure is sealed in a shell (not shown) to complete the SAW resonator 100 according to the present invention.

A printed circuit board for mounting the SAW resonator 100 of both in phase and out of phase type will be described with reference to FIG. 11.

Figure 11:
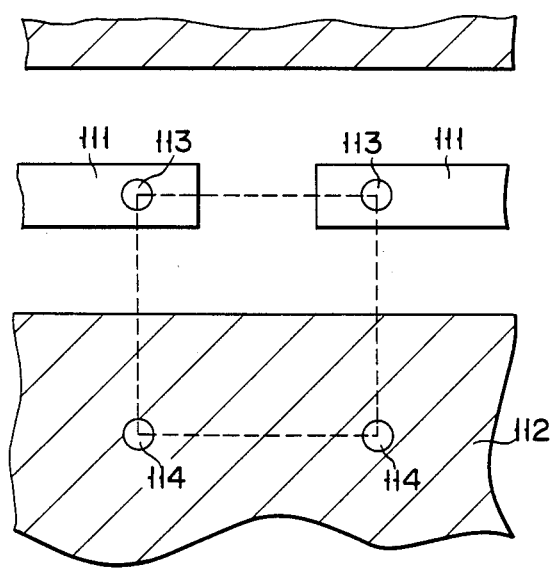
FIG. 11 is a schematic view showing a printed circuit board for mounting the SAW resonator shown in FIG. 10.

Referring to FIG. 11, reference numeral 111 denotes a signal line pattern, and refence numeral 112 denotes a grounding line pattern. When the SAW resonator 100 shown in FIG. 10 is used as an in phase type, the lead pins 78 and 79 are inserted in openings 113 of the signal line pattern 111, and the lead pins 80 and 101 are inserted in openings 114 of the grounding line pattern 112. However, when the SAW resonator shown in FIG. 10 is used as an out of phase type, the lead pins 78 and 80 are inserted in the openings 113 of the signal line pattern 111, and the lead pins 79 and 101 are inserted in the openings 114 of the grounding line pattern 112.

As described above, in the SAW resonator 100 shown in FIG. 10, the tops of the four lead pins 78, 79, 80 and 101 extending above the stem surface mounting the SAW resonator element 76 correspond to corners of a square. Therefore, the SAW resonator 100 can be easily operated as either an in phase or out of phase type SAW resonator by turning the SAW resonator 100 relative to the printed circuit board through about 90 degrees. Therefore, only a single type of wiring need be formed.

In the SAW resonator 100 shown in FIG. 10, four lead pins 78, 79, 80 and 101 are all electrically connected to the stem 82 s that the stem is electrically floating from the ground level in the operative mode. A second embodiment of a SAW resonator of the present invention wherein a stem is set at the ground level will be described with reference to FIG. 12.

Figure 12:
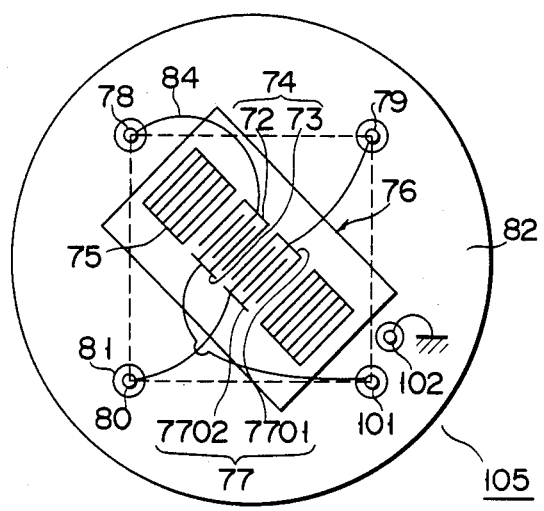
FIG. 12 is a plan view showing a second embodiment of an acoustic surface wave resonator of the present invention.

Referring to FIG. 12, the basic structure of a SAW resonator 105 remains the same as that of the SAW resonator 100, and a detailed description thereof will be omitted. In the SAW resonator 105, a grounding lead terminal, for example, a grounding pin 102 is arranged at a vicinity of a lead pin 101 and is electrically connected to a stem 82. A printed circuit board for mounting the SAW resonator 105 will be described by reference to FIG. 13.

Figure 13:
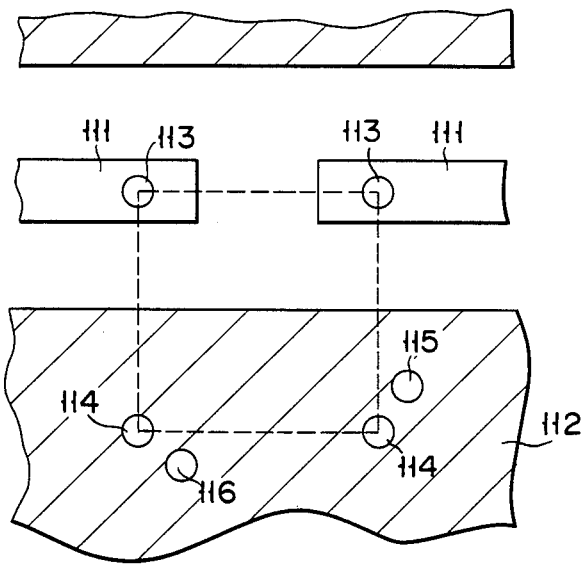
FIG. 13 is a schematic view showing a printed circuit board for mounting the SAW resonator shown in FIG. 12.

Referring to FIG. 13, four openings 113 and 114 similar to those in FIG. 11 are formed in the printed circuit board. In addition, openings 115 and 116 for receiving a grounding pin 102 of the SAW resonator 105 are also formed in the board. Therefore, when the SAW resonator 105 is used as an in phase type SAW resonator, lead pins 78 and 79 are inserted in the openings 113 of a signal line pattern 111, and lead pins 80 and 101 are inserted in the openings 114 of a grounding line pattern 112. The grounding pin 102 is inserted in the opening 115 of the grounding line pattern 112. Naturally, no lead pin is inserted in the opening 116 in this case. On the other hand, when the SAW resonator 105 is used as an out of phase type SAW resonator, the lead pins 78 and 80 are inserted in the openings 113 of the signal line pattern 111, the lead pins 79 and 101 are inserted in the opening 114 of the grounding line pattern 112, and the grounding pin 102 is inserted in the opening 116.

In this manner, even when the stem has a grounding pin 102, when the openings 115 and 116 for receiving the grounding pin 102 are formed, a similar effect may be obtained.

Figure 14:
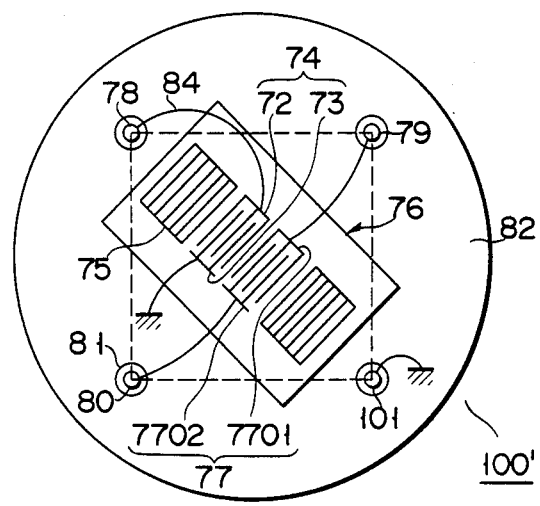
FIG. 14 is a plan view showing a third embodiment of an acoustic surface wave resonator of the present invention.

FIG. 14 shows a third embodiment in which the arrangement shown in FIG. 10 is modified and which is the same as the embodiment shown in FIG. 10 except that a lead pin 101 and a second comb-shaped electrode 73 are grounded through a stem 82 via bonding wires 84. Therefore, in this case, as in the case of FIG. 10, a printed circuit board as shown in FIG. 11 can be used.

In the embodiment described above, the tops of the lead pins electrically connected to the interdigital electrode of a SAW resonator extending above the surface of a stem correspond to corners of a square. However, the present invention is not limited to this arrangement, and these tops can correspond to corners of a regular triangle, pentagon, hexagon, heptagon, octagon, nonagon and other regular polygons. Additionally, the distance between the lead pins 78 and 79 need only be substantially equal to that between the lead pins 78 and 80. Note that the bonding wires 84 must not contact each other.

A fourth embodiment of the present invention will now be described with reference to FIG. 15. The same reference numerals in FIG. 15 denote the same parts as in FIG. 10.

Figure 15:
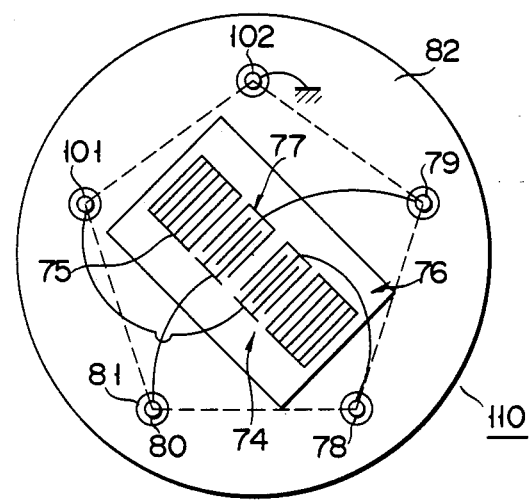
FIG. 15 is a plan view showing a fourth embodiment of an acoustic surface wave resonator of the present invention.

Referring to FIG. 15, one of the comb-shaped electrodes constituting a first interdigital electrode 74 is electrically connected to a lead pin 78 through a bonding wire. The other comb-shaped electrode of the first interdigital electrode 74 is electrically connected to a lead pin 101. Comb-shaped electrodes of a second interdigital electrode 77 are electrically connected to lead pins 79 and 80 through bonding wires. A lead pin 102 is electrically connected to a stem 82 through a bonding wire. The tops of the lead pins 78, 79, 80, 101 and 102 projecting above a surface of the stem 82 mounting a SAW resonator element 76 correspond to corners of a regular pentagon.

Figure 16:
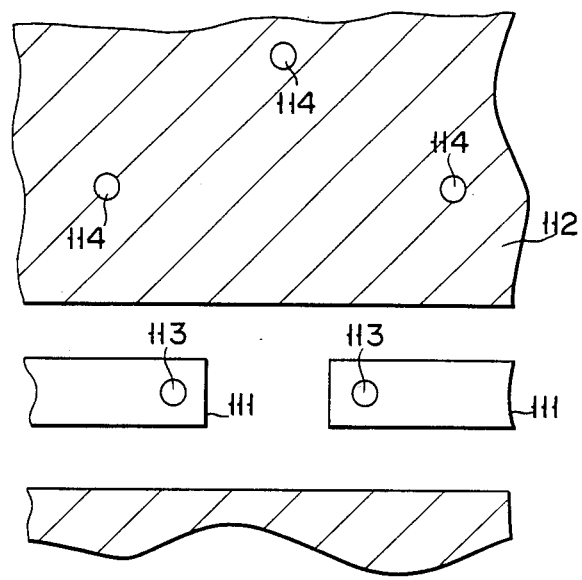
FIG. 16 is a schematic view showing a printed circuit board for mounting the SAW resonator shown in FIG. 15.

FIG. 16 shows a surface of a printed circuit board for mounting the SAW resonator 110 shown in FIG. 15.

Referring to FIG. 16, reference numeral 111 denotes a signal line pattern, and reference numeral 112 denotes a grounding line pattern. When the SAW resonator is used as an in phase type SAW resonator, the lead pins 78 and 79 are inserted in openings 113 of the signal line pattern 111, and the lead pins 80, 101 and 102 are inserted in openings 114 of the grounding line pattern 112. However, when the SAW resonator 110 is used as an out of phase type SAW resonator, the lead pins 78 and 80 ar inserted in the openings 113 of the signal line pattern 111, and the lead pins 79, 101 and 102 are inserted in the openings 114 of th grounding line pattern 112. In this case, the stem 82 is set at the ground level through the lead pin 102. In order to electrically float the stem 82, the lead pin 102 and the stem 82 must be electrically insulated from each other.

Figure 17:
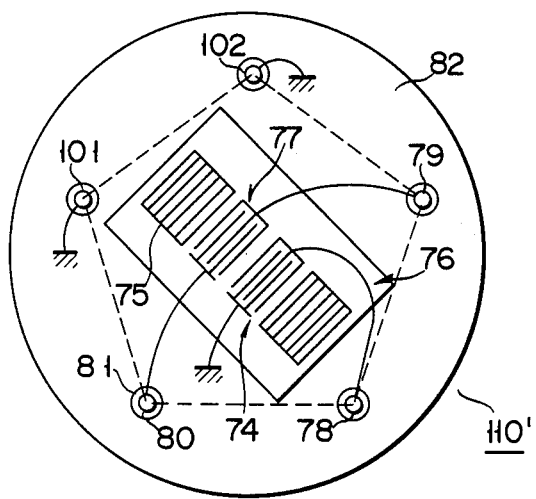
FIG. 17 is a plan view showing a fifth embodiment of an acoustic surface wave resonator of the present invention.

FIG. 17 shows a fifth embodiment of the present invention which is a modification of the arrangement shown in FIG. 15. This embodiment is the same as that shown in FIG. 15 except that lead pins 101 and 102 and the other comb-shaped electrode of a first interdigital electrode 74 are grounded through a stem 82 via bonding wires. Therefore, in this case, a printed circuit board shown in FIG. 16 can be used as in the case of the embodiment shown in FIG. 15.

The SAW resonator 110 or 110' obtained in this manner can provide a similar effect to that obtainable with the SAW resonator shown in FIG. 10.

A sixth embodiment of the present invention will be described with reference to FIG. 18. The same reference numerals as in FIG. 12 denote the same parts in FIG. 18.

Figure 18:
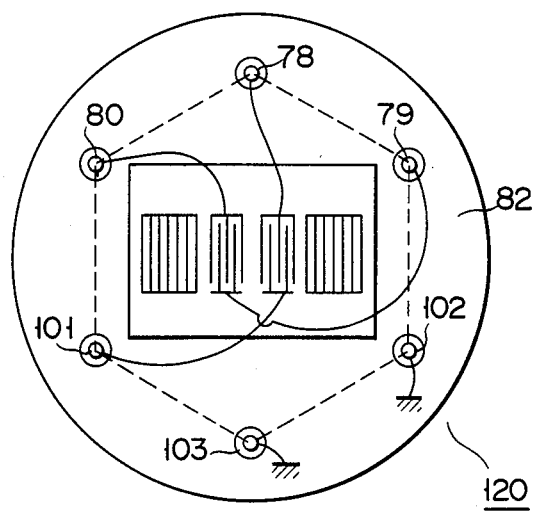
FIG. 18 is a plan view of a sixth embodiment of an acoustic surface wave resonator of the present invention.

Referring to FIG. 18, tops of lead pins 78, 79, 80, 101, 102 and 103 projecting from a surface of a stem 82 correspond to corners of a regular hexagon. A surface of a printed circuit board mounting such a SAW resonator 120 is as shown in FIG. 19.

Figure 19:
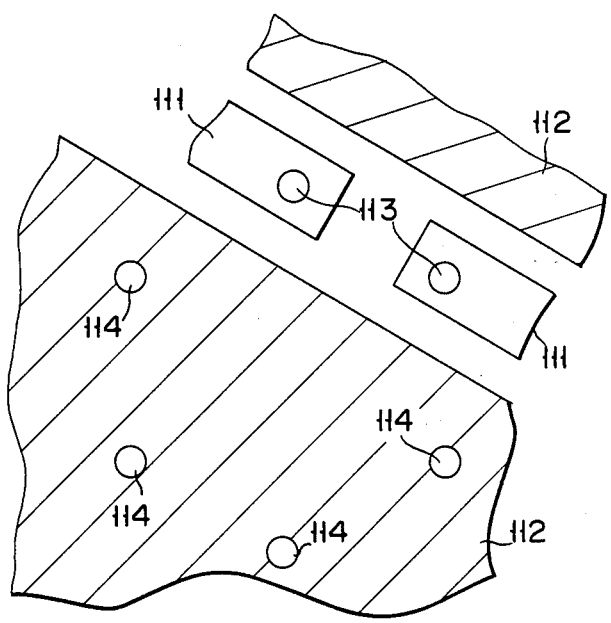
FIG. 19 is a schematic view showing a printed circuit board for mounting the SAW resonator shown in FIG. 18.

Referring to FIG. 19, reference numeral 111 denotes a signal line pattern, and reference numeral 112 denotes a grounding line pattern. When the SAW resonator 120 is used as an in phase type SAW resonator, the lead pins 78 and 80 are inserted in openings 113 of the signal line pattern 111, and the lead pins 80, 101, 102 and 103 are inserted in openings 114 of the grounding line pattern 112. When the SAW resonator 120 is used as an out of phase SAW resonator, the lead pins 78 and 79 are inserted in the openings 113 of the signal line pattern 111, and the lead pins 79, 101, 102 and 103 are inserted in the openings 114 of the grounding line pattern 112.

Figure 20:
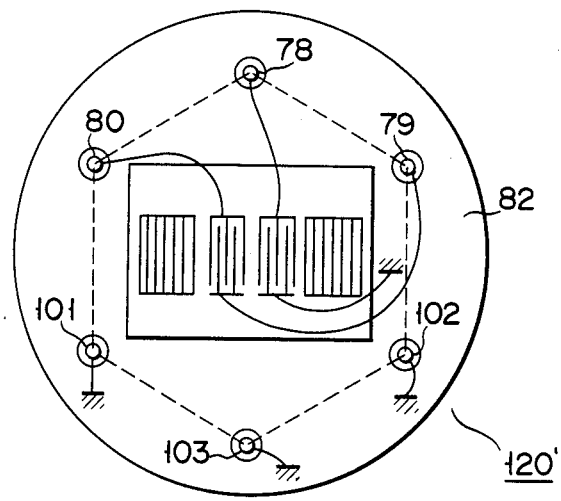
FIG. 20 is a plan view showing a seventh embodiment of an acoustic surface wave resonator of the present invention.

FIG. 20 shows a seventh embodiment which is a modification of the embodiment shown in FIG. 18. The embodiment shown in FIG. 20 is the same as that shown in FIG. 18 except that the lead pins 101, 102 and 103 and the other comb-shaped electrode of a first interdigital electrode 74 are grounded through a stem 82 via bonding wires. Therefore, in this case, as in the case of the embodiment shown in FIG. 18, a printed circuit board as shown in FIG. 19 can be used.

In this manner, a SAW resonator 120 or 120' according to the sixth or seventh embodiment of the present invention can provide a similar effect to that obtainable with the SAW resonator shown in FIG. 10. In addition, a higher resistance to vibration or the like can be obtained than in the case wherein the SAW resonator 110 shown in FIG. 15, for example, is mounted on the printed circuit board.

A desired effect of the present invention can be obtained if the tops of at least three of the lead pins electrically connected to interdigital electrodes mounted in the stem extending above the stem correspond to corners of a regular polygon. Of course the lead pins need not necessarily extend above the surface of the stem of the SAW resonator but need only be electrically connected to comb-shaped electrodes or stem through bonding wires or the like.

The first to seventh embodiments were described with reference to a case wherein the lead pins 78, 79 and 80 correspond to corners of a regular polygon. However, the effect of the present invention can be obtained if the distance between the lead pins 78 and 79 is substantially equal to that between the lead pins 78 and 80. Thus, it is to be understood that the lead pins 78, 79 and 80 may correspond to corners of a regular triangle. In addition, the grounding lead pins 102 and 103 shown in FIGS. 15, 17, 18 and 20 are not necessary and can be incorporated in accordance with whether or not the stem 82 is set at the ground potential.

Figure 21:
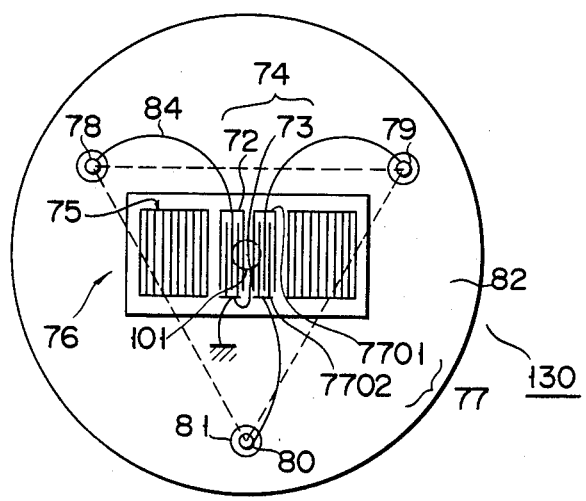
FIG. 21 is a plan view of an eighth embodiment of an acoustic surface wave resonator of the present invention.

FIG. 21 shows an eighth embodiment of the present invention wherein the lead pins 78, 79 and 80 correspond to corners of a regular triangle. Since the basic structure of a SAW resonator 130 shown in FIG. 21 is the same as the SAW resonator 90 developed by the present inventors and shown in FIG. 7, a detailed description will be omitted. The same reference numerals in the SAW resonator 130 shown in FIG. 21 denote the same parts in the SAW resonator 90 shown in FIG. 7.

In FIG. 21, a SAW resonator element 76 has interdigital electrodes 74 and 77 and two sets of SAW reflectors 76 and is mounted on a base, for example, a stem 82 consisting of a metal. Lead pins 78, 79 and 80 extend through the stem 82 through adhering members 81. The tops of the lead pins 78, 79 and 80 extending above the surface of the stem 82 correspond to corners of a regular triangle. In other words, the distance between the lead pins 78 and 80, that between the lead pins 78 and 79, and that between the lead pins 79 and 80 is substantially the same. A first comb-shaped electrode 7701 of the interdigital electrode 77 is electrically connected to the lead pin 79 through a bonding wire 84. A second comb-shaped electrode 7702 is electrically connected to the lead pin 80 through another bonding wire 84. A first comb-shaped electrode 72 of the interdigital electrode 74 is electrically connected to the lead pin 78 through still another bonding wire 84. A second comb-shaped electrode 73 is grounded through the stem 82 via still another bonding wire 84. A lead pin 101 for grounding is electrically connected to the center of gravity of the imaginary regular triangle formed by the lead pins 78, 79 and 80, i.e., at a position equally separated from the lead pins 78, 79 and 80. The lead pin 101 can be directly mounted in the stem 82 by welding.

In this SAW resonator 130, a common signal lead pin is designated by reference numeral 78, an in-phase signal lead pin is designated by reference numeral 79, and an out-of-phase signal lead pin is designated by reference numeral 80. The structure is sealed by a shell (not shown) to complete the SAW resonator 130 of the present invention. It is to be understood that each lead pin need not project above the surface of the stem 82.

A printed circuit board for mounting the SAW resonator 130 which can be used as either an in phase or out of phase type will be described with reference to FIG. 22.

Referring to FIG. 22, reference numeral 111 denotes a signal line pattern, and reference numeral 112 denotes a grounding line pattern. When the SAW resonator 130 is used as an in phase type SAW resonator, the lead pins 78 and 79 are inserted in openings 113 of the signal line pattern 111, the lead pin 80 is inserted in an opening 114 of the grounding line pattern 112, and the grounding lead pin 101 is inserted in an opening 115.

When the SAW resonator 130 shown in FIG. 21 is used as an out of phase type SAW resonator, the insertion state of the SAW resonator used as an in phase type is rotated through about 120 degrees clockwise. Thus, the lead pins 78 and 80 are inserted in the openings 113, and the lead pin 79 is inserted in the opening 114. The grounding pin 101 is inserted in the opening 115.

As described above, the SAW resonator 130 shown in FIG. 21 can be used as either an in phase or out of phase SAW resonator by changing only the lead pin insertion positions using a single printed circuit board.

When the lead pins 79 and 80 are inserted in the openings 113 and the lead pin 78 is inserted in the opening 114, the SAW resonator 130 can be used as a 1-port resonator using only the interdigital electrode 77. Therefore, the SAW resonator of the eighth embodiment of the present invention can be used with a single SAW resonator and a single printed circuit board as:

1. In phase type 2-port resonator
2. Out of phase type 2-port resonator
3. 1-port resonator In this embodiment, the grounding lead pin 101 is located at the center of gravity of the regular triangle. However, the lead pin 101 can be located at a position substantially equidistant from the lead pins 79 and 80. The grounding lead pin can be located near the center of gravity of the regular triangle.

A ninth embodiment of the present invention will be described with reference to FIG. 23.

Referring to FIG. 23, a SAW resonator element 76 has interdigital electrodes 74 and 77 and two sets of SAW reflectors 75 is mounted on a base, for example, a stem 82 consisting of a metal. Lead pins 78, 79 and 80 extend through the stem 82 through adhering members 81. The tops of the lead pins 78, 79 and 80 extending above the surface of the stem 82 mounting the SAW resonator element 76 are located substantially on a line 95. A distance 93 between the tops of the lead pins 78 and 80 extending above the surface of the stem 82 is substantially equal to a distance 94 between those of the lead pins 79 and 80. In other words, the distance between the lead pins 78 and 80 is equal to that between the lead pins 78 and 79. A first comb-shaped electrode 7701 of the interdigital electrode 77 is electrically connected to the lead pin 80 through a bonding wire 84, and a second comb-shaped electrode 7702 is electrically connected to the lead pin 79 through another bonding wire 84. A first comb-shaped electrode 72 of the interdigital electrode 74 is electrically connected to the lead pin 78 through still another bonding wire 84, and a second comb-shaped electrode 73 is electrically connected to a lead pin 1011 through still another bonding wire 84. A grounding lead pin 1012 is located substantially on the line 95. The distances between the lead pin 78 and the lead pins 1011 and 1012, respectively, are substantially the same. The lead pin 1012 can be directly mounted in the stem 82 by welding or the like.

As described above, the lead pin 1011 and the grounding lead pin 1012, and the lead pins 79 and 80 are point symmetrical with respect to the position of the lead pin 78. In a SAW resonator 200, a common signal lead pin is designated by reference numeral 78, an in-phase-signal lead pin is designated by reference numeral 79, and an out-of-phase signal lead pin is designated by reference numeral 80. The structure is sealed in a shell (not shown), and the SAW resonator according to the ninth embodiment of the presen invention is completed. It is to be noted that each lead pin need not project above the surface of the stem 82.

A printed circuit board for mounting this SAW resonator 200 which can be used as either an in phase or out of phase type SAW resonator will be described with reference to FIG. 24.

Referring to FIG. 24, reference numerals 1111 and 1112 denote signal line patterns, and reference numeral 112 denotes a grounding line pattern. When the SAW resonator 200 shown in FIG. 23 is used as an in phase type SAW resonator, the lead pins 78 and 79 are respectively inserted in an opening 1131 of the signal line pattern 1111 and an opening 1132 of the signal line pattern 1112, the lead pin 80 is inserted in an opening 114 of the grounding line pattern 112, and the lead pin 1011 and the grounding lead pin 1012 are inserted in openings 1151 and 1152. When the SAW resonator 200 shown in FIG. 23 is used as an out of phase SAW resonator, the inserting state in an SAW resonator of in phase type is rotated through about 180 degrees relative to the position of the lead pin 78. That is, the lead pins 78 and 80 are inserted in the openings 1131 and 1132, the lead pin 79 is inserted in the opening 114 of the grounding wiring pattern, and the lead pin 1011 and the grounding lead pin 1012 are inserted in openings 1152 and 1151.

The SAW resonator 200 shown in FIG. 23 can be used as either an in phase or out of phase type SAW resonator by turning the lead pin insertion positions about the lead pin 78 using only a single printed circuit board. With the SAW resonator 200 shown in FIG. 23, a grounding lead pin is interposed between the signal lead pins. Therefore, electromagnetic coupling between the signal wiring patterns or capacitive coupling in a printed circuit board are suppressed.

Figure 1:
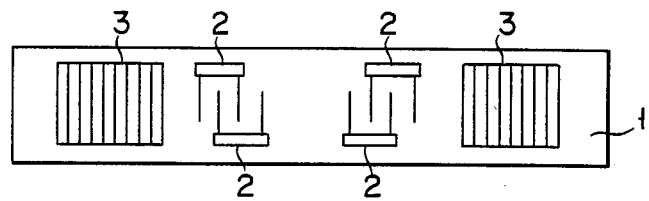
FIG. 1 is a view for explaining the principle of an acoustic surface wave (SAW) resonator.
Figure 2:
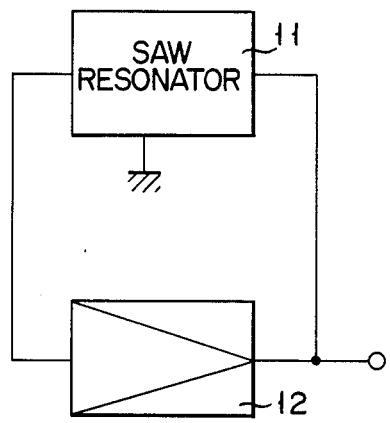
FIG. 2 is a schematic view showing an oscillator using the SAW resonator shown in FIG. 1.
Figure 3:
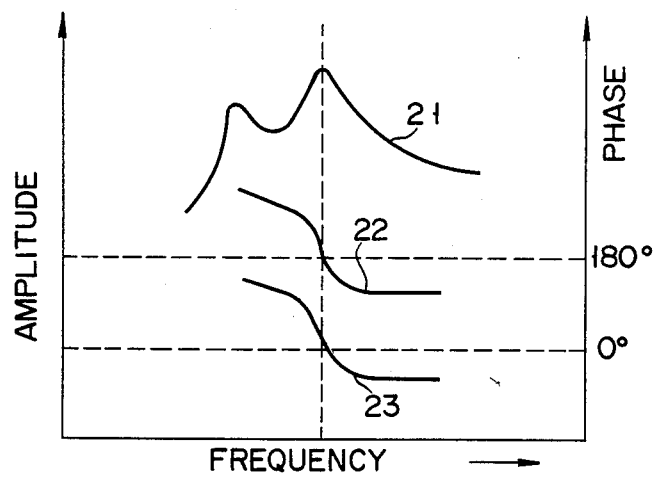
FIG. 3 is a graph showing the frequency characteristics of the SAW resonator shown in FIG. 1.

FIG. 25 shows a SAW resonator 200' of a tenth embodiment of the present invention which is a modification of the emodiment shown in FIG. 23. This embodiment is the same as that shown in FIG. 23 except that lead pins 1011 and 1012 and the other comb-shaped electrode of a first interdigital electrode 74 are grounded through a stem 82 via bonding wires. Therefore, in this case, a printed circuit board as shown in FIG. 2 can be used as in the case of FIG. 23.

In the SAW resonators 200 or 200' shown in FIGS. 23 and 25, two grounding lead pins are used. However, the grounding pins may be one or more in number. In other words, when a single grounding lead pin is used, the relationship between the grounding lead pin and printed pattern on a printed circuit board can be arranged as shown in FIGS. 23 and 25 or as in FIG. 24 to allow the SAW resonator to operate as either an in phase or out of phase type SAW resonator. When a plurality of grounding lead pins are used, they can be arranged at positions point symmetrical with respect to the lead pin 78.

In the above embodiment, a metal stem 82 is used. However, the base need not comprise a metal stem and may comprise, for example, a high-resistance substrate coated with a thin conductive film. A shell need not be used for sealing or encapsulation, and resin molding or the like may be adopted instead.

According to the present invention, an SAW resonator of either in phase or out of phase type can be obtained. Therefore, a single SAW resonator can be operated as either an in phase or out of phase type SAW resonator using only a single type of printed circuit board.

What is claimed is:

1. An assembly for an acoustic surface wave resonator device and a printed circuit board, said assembly comprising:
   (a) an acoustic surface wave resonator element having a piezoelectric substrate, first and second interdigital electrodes formed on one major surface of said piezoelectric substrate, said first interdigital electrode including first and second interleaving comb-shaped electrodes separated at a predetermined distance from each other on said major surface of said piezoelectric substrate, said second interdigital electrode including third and fourth interleaving comb-shaped electrodes separated at a predetermined distance from each other on said major surface of said piezoelectric substrate, and a pair of acoustic surface wave reflectors formed on said major surface of said piezoelectric substrate so as to sandwich said first and second interdigital electrodes;
   (b) a base for mounting said acoustic surface wave resonator element thereon;
   (c) first, second, and third lead terminals arranged on said base at positions substantially corresponding to three adjacent corners of a regular n-sided polygon, said first lead terminal being disposed between said second and third lead terminals;
   (d) a first connection member for connecting said first lead terminal to said first interleaving comb-shaped electrode;
   (e) a second connection member for connecting said second lead terminal to said third interleaving comb-shaped electrode;
   (f) a third connection member for connecting said third lead terminal to said fourth interleaving comb-shaped electrode, and
   (g) reference potential applying means coupled to said second interleaving comb-shpaed electrode to apply a reference potential thereto; and
   a printed circuit board having first, second, and third openings arranged in correspondence with said first, second, and third lead terminals of said acoustic surface wave resonator device so as to respectively receive said first, second, and third lead terminals, first and second signal line patterns being respectively provided in said first and second openings, and a grounding line pattern being provided in said third opening;
   said first, second, and third lead terminals of said acoustic surface wave resonantor device being respectively inserted in said first, second, and third openings of said printed circuit board with a first orientational relationship with respect to said printed circuit board when used in an in-phase oscillator application, said first, second, and third lead terminals being inserted in said openings with a second orientational relationship with respect to said printed circuit board which is different from said first orientational relationship when used in an out-of-phase oscillator application, the difference between the first and second orientational relationshps being provided by rotating said first to third lead terminals by an angle $2\pi/\eta$ of with respect to said printed circuit board.

2. An assembly according to claim 1, wherein said base comprises a stem made of a metal.

3. An assembly according to claim 1, wherein said reference potential applying means includes a fourth lead terminal formed on said base.

4. A device according to claim 3, wherein said fourth lead terminal is directly coupled to said second interleaving comb-shaped electrode.

5. A device according to claim 3, wherein said fourth lead terminal is coupled to said second interleaving comb-shaped electrode through said base.

6. A device according to claim 4, wherein said first to fourth lead terminals are arranged at positions on said base substantially corresponding to four corners of a regular polygon.

7. A device according to claim 4, wherein said first to fourth lead terminals are arranged at positions on said base substantially corresponding to four corners of a regular polygon.

8. A device according to claim 6, wherein the regular polygon is a square.

9. A device according to claim 7, wherein the regular polygon is a square.

10. A device according to claim 6, wherein the regular polygon is a regular pentagon.

11. A device according to claim 7, wherein the regular polygon is a regular pentagon.

12. A device according to claim 6, wherein the regular polygon is a regular hexagon.

13. A device according to claim 6, wherein the regular polygon is a regular hexagon.

14. A device according to claim 4, wherein said first to third lead terminals are arranged at positions on said base substantially corresponding to corners of a regular triangle, and said fourth lead terminal is arranged at a position on said base substantially corresponding to a center of gravity of the regular triangle.

15. A device according to claim 4, wherein said first to third lead terminals are arranged at positions on said base substantially corresponding to corners of a regular triangle, and said fourth lead terminal is arranged at a position on said base substantially corresponding to a center of gravity of the regular triangle.

16. A device according to claim 3, wherein a base grounding lead terminal is also arranged on said base on which said first to fourth lead terminals are formed.

17. A device according to claim 16, wherein at least one of said base grounding lead terminals is formed on a position of said base substantially corresponding to one corner of a regular polygon having at least five corners.

18. A device according to claim 16, wherein said base grounding lead terminal is arranged on said base to be point symmetrical with said fourth lead terminal with respect to said third lead terminal, and said base grounding terminal and said first to fourth lead terminals are formed linearly on said base.

19. An assembly for an acoustic surface wave resonator device and a printed circuit board, said assembly comprising:
an acoustic surface wave resonator device including,
(a) an acoustic surface wave resonator element including a piezoelectric substrate, first and second interdigital electrodes formed on one major surface of said piezoelectric substrate, said first interdigital electrode including first and second interleaving comb-shaped electrodes separated at a predetermined distance from each other on said major surface of said piezoelectric substrate, said second interdigital electrode including third and fourth interleaving comb-shaped electrodes separated at a predetermined distance from each other on said major surface of said piezoelectric substrate, and a pair of acoustic surface wave reflectors formed on said major surface of said piezoelectric substrate so as to sandwich said first and second interdigtal electrodes;
. (b) a base for mounting said acoustic surface wave resonator element thereon;
(c) first, second, and third lead terminals linearly arranged on said base at equal intervals therebetween with said first lead terminal being positioned between said second and third terminals;
(d) a first connection member for connecting said first lead terminal to said first interleaving comb-shaped electrode;
(e) a second connection member for connecting said second lead terminal to said third interleaving comb-shaped electrode;
(f) a third connection member for connecting said third lead terminal to said fourth interleaving comb-shaped electrode, and
(g) reference potential applying means coupled to said second interleaving comb-shaped electrode to apply a reference potential thereto; and
a printed circuit board having first, second, and third lead terminals of said acousitc surface wave resonator device so as to respectively receive said first, second, and third lead terminals, firsxt and second signal line patterns being respectively provided in said first and second openings, and a grounding line pattern being in said third opening;
said first, second, and third lead terminals of said acoustic surface wave resonator device being inserted in said first, second, and third openings of said printed circuit board with a first orientational relationship with respect to said printed circuit board when used in an in-phase oscillator application, said first, second, and third lead terminals being inserted in said openings with a second orientational relationship with respect to said printed circuit board which is different from said first orientational relationship when used in an out-of-phase oscillator application, the difference between the orientational relationships being provided by rotating said first to third lead terminals by 180 degrees with respect to said printed circuit board.

20. An assembly according to claim 19, wherein said reference potential applying means includes a fourth lead terminal formed on said base.

21. An assembly according to claim 20, wherein said fourth lead terminal is directly coupled to said second interleaving comb-shaped electrode.

22. An assembly according to claim 26, wherein said fourth lead terminal is coupled to said second interleaving comb-shaped electrode through said base.

23. An assembly according to claim 20, wherein a base grounding lead terminal is also arranged on said base on which said first, second, third, and fourth lead terminals are formed.

24. An assembly according to claim 19, wherein said base comprises a stem made of metal.

25. An assembly according to claim 21, wherein said first, second, third, and fourth lead terminals are arranged substantially linearly on said base when said fourth lead terminal is located at a midpoint between said third lead terminal and one of said first and second lead terminals.

26. An assembly according to claim 22, wherein said first, second, third, and fourth lead terminals are arranged substantially linearly on said base when said fourth lead terminal is located at a midpoint between said third lead terminal and one of said first and second lead terminals.

* * * * *